United States Patent
Park et al.

(10) Patent No.: US 9,093,146 B2
(45) Date of Patent: Jul. 28, 2015

(54) NONVOLATILE MEMORY DEVICE AND RELATED METHOD FOR REDUCING ACCESS LATENCY

(71) Applicant: SAMSUNG ELECTRONICS CO., LTD., Suwon-Si, Gyeonggi-Do (KR)

(72) Inventors: Eun-Hye Park, Iksan-Si (KR); Hoi-Ju Chung, Yongin-Si (KR); Yong-Jin Kwon, Suwon-Si (KR); Hyo-Jin Kwon, Seoul (KR); Yong-Jun Lee, Hwaseong-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 58 days.

(21) Appl. No.: 14/171,849

(22) Filed: Feb. 4, 2014

(65) Prior Publication Data

US 2014/0247645 A1  Sep. 4, 2014

(30) Foreign Application Priority Data

Mar. 4, 2013  (KR) ........................ 10-2013-0023004

(51) Int. Cl.
*G11C 8/18* (2006.01)
*G11C 13/00* (2006.01)

(52) U.S. Cl.
CPC ........ *G11C 13/0061* (2013.01); *G11C 13/0002* (2013.01); *G11C 13/004* (2013.01)

(58) Field of Classification Search
CPC .......... G11C 7/222; G11C 7/225; G11C 7/22; G11C 8/10; G11C 8/18; G11C 11/5678; G11C 13/0061
USPC ............ 365/233.13, 233.14, 233.19, 230.08, 365/230.06, 189.15, 189.05, 203, 148, 163
See application file for complete search history.

(56) References Cited

U.S. PATENT DOCUMENTS

| | | | |
|---|---|---|---|
| 6,292,430 B1 | 9/2001 | Ohtake et al. | |
| 6,426,915 B2 | 7/2002 | Ohshima et al. | |
| 6,427,197 B1 | 7/2002 | Sato et al. | |
| 6,538,956 B2 | 3/2003 | Ryu et al. | |
| 7,057,950 B2 * | 6/2006 | Lee ............................... | 365/203 |
| 7,278,044 B2 | 10/2007 | Song | |
| 7,577,047 B2 | 8/2009 | Jeong | |
| 7,581,127 B2 * | 8/2009 | Rajan et al. .................... | 713/320 |
| 7,633,831 B2 | 12/2009 | Ikeda | |
| 8,050,137 B2 | 11/2011 | Lee | |
| 8,059,484 B2 | 11/2011 | Yoko | |
| 8,527,802 B1 * | 9/2013 | Tran et al. ..................... | 713/400 |
| 2002/0181305 A1 | 12/2002 | Protzman et al. | |
| 2009/0257292 A1 * | 10/2009 | Lee et al. ................. | 365/189.15 |

* cited by examiner

*Primary Examiner* — Andrew Q Tran
(74) *Attorney, Agent, or Firm* — Voltentine & Whitt, PLLC

(57) ABSTRACT

A nonvolatile memory device comprises a memory core comprising a plurality of variable resistance memory cells, an input/output (I/O) circuit configured to receive a first packet signal and a second packet signal in sequence, the first and second packet signals collectively comprising information for a memory access operation, and further configured to initiate a core access operation upon decoding the first packet signal and to selectively continue or discontinue the core access operation upon decoding the second packet signal, and a read circuit configured to perform part of the core access operation in response to the first packet signal before the second packet signal is decoded.

20 Claims, 10 Drawing Sheets

| | | CA pins (10) | | | | | | | | | |
|---|---|---|---|---|---|---|---|---|---|---|---|
| | CLK | CA0 | CA1 | CA2 | CA3 | CA4 | CA5 | CA6 | CA7 | CA8 | CA9 |
| P1 | rising | L | H | a15 | a16 | a17 | a18 | a19 | BA0 | BA1 | x |
| P2 | falling | a5 | a6 | a7 | a8 | a9 | a10 | a11 | a12 | a13 | a14 |

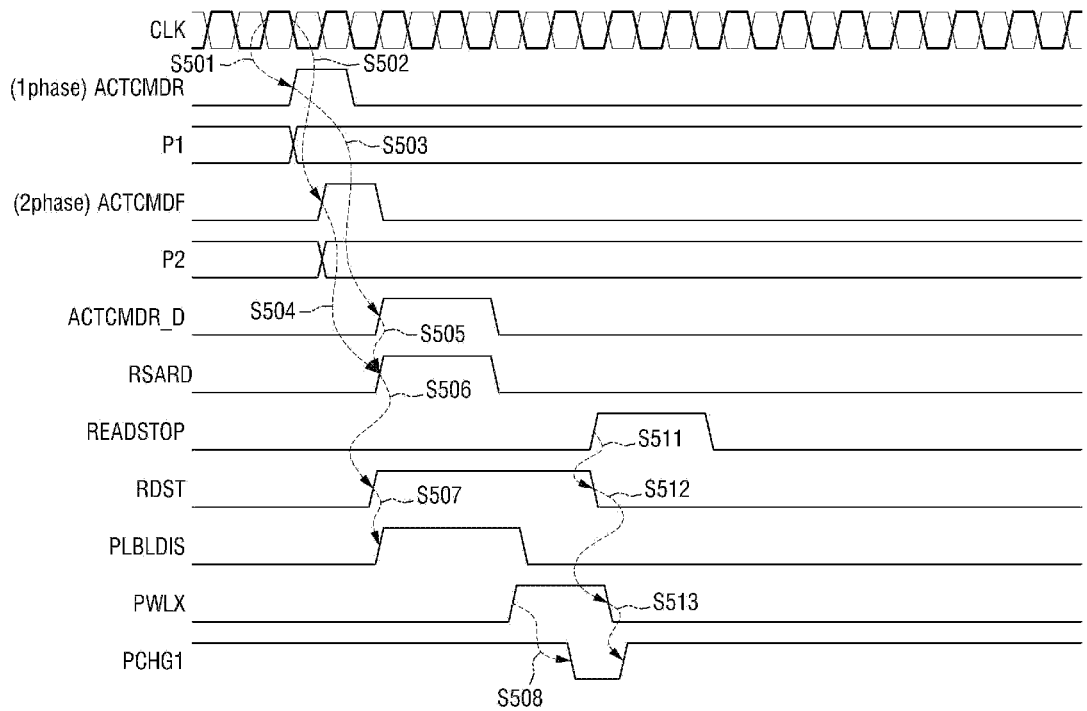
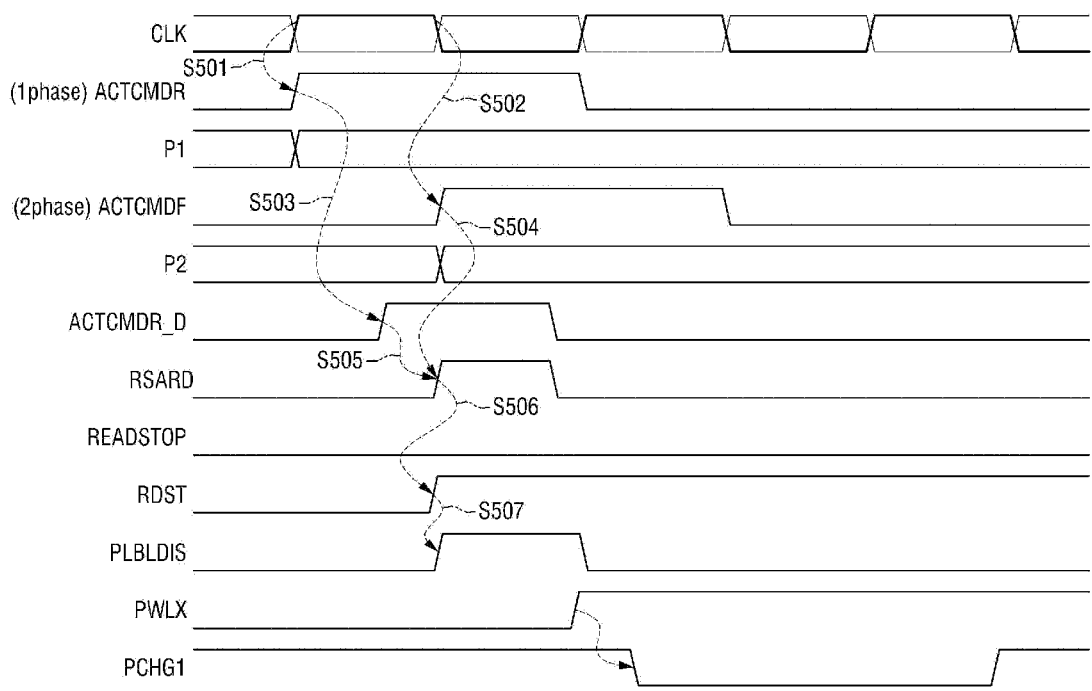

NONVOLATILE MEMORY DEVICE AND RELATED METHOD FOR REDUCING ACCESS LATENCY

CROSS-REFERENCE TO RELATED APPLICATION

This application claims priority under 35 U.S.C. §119 to Korean Patent Application No. 10-2013-0023004 filed on Mar. 4, 2013, the subject matter of which is hereby incorporated by reference.

BACKGROUND OF THE INVENTION

The inventive concept relates generally to nonvolatile memory device comprising variable resistance memory cells, and related methods of operation.

Some memory devices store information using variable resistance materials. Such devices may be referred to generally as variable resistance memory devices. Examples of such devices include phase-change random access memories (PRAMs), resistive RAMs (RRAMs), and magnetic RAMs (MRAMs).

In a typical variable resistance memory device, information is stored by changing a storage element from a first resistance state (e.g., low resistance) corresponding to a first data value (e.g., a "1") to a second resistance state (e.g., high resistance) corresponding to a second data value (e.g., a "0"). For example, in a PRAM, information is stored by applying electrical current to a phase-change material such as chalcogenide to change it from a crystalline state (or "set" state) of relatively high resistance to an amorphous state (or "reset" state) of relatively low resistance, or vice versa. In the PRAM, the electrical current is used to heat and then cool the phase-change material such that it assumes either the set state or the reset state.

In some variable resistance memory devices, memory cells share a virtual address space with other components, such as registers, buffers, or other memories. The memory cells may have different access latency compared to the other components, so the timing of a read or write command may depend on whether the corresponding virtual address designates memory cells or some other components.

SUMMARY OF THE INVENTION

In one embodiment of the inventive concept, a nonvolatile memory device comprises a memory core comprising a plurality of variable resistance memory cells, an input/output (I/O) circuit configured to receive a first packet signal and a second packet signal in sequence, the first and second packet signals collectively comprising information for a memory access operation, and further configured to initiate a core access operation upon decoding the first packet signal and to selectively continue or discontinue the core access operation upon decoding the second packet signal, and a read circuit configured to perform part of the core access operation in response to the first packet signal before the second packet signal is decoded.

In another embodiment of the inventive concept, a method of operating a nonvolatile memory device comprises receiving a first packet signal and a second packet signal in sequence, the first and second packet signals collectively comprising information for a memory access operation, decoding the first packet signal, initiating a core access operation with respect to a memory array of the nonvolatile memory device upon decoding the first packet signal, and thereafter decoding the second packet signal, selectively continuing or discontinuing the core access operation upon decoding the second packet signal.

These and other embodiments of the inventive concept can potentially improve the performance of a nonvolatile memory device by reducing access latency for core access operations.

BRIEF DESCRIPTION OF THE DRAWINGS

The drawings illustrate selected embodiments of the inventive concept. In the drawings, like reference numbers indicate like features.

FIG. 11 is a timing diagram illustrating a method of operating a nonvolatile memory device, according to an embodiment of the inventive concept.

FIG. 12 is a timing diagram illustrating a method of operating a nonvolatile memory device, according to an embodiment of the inventive concept.

DETAILED DESCRIPTION

Figure 1:
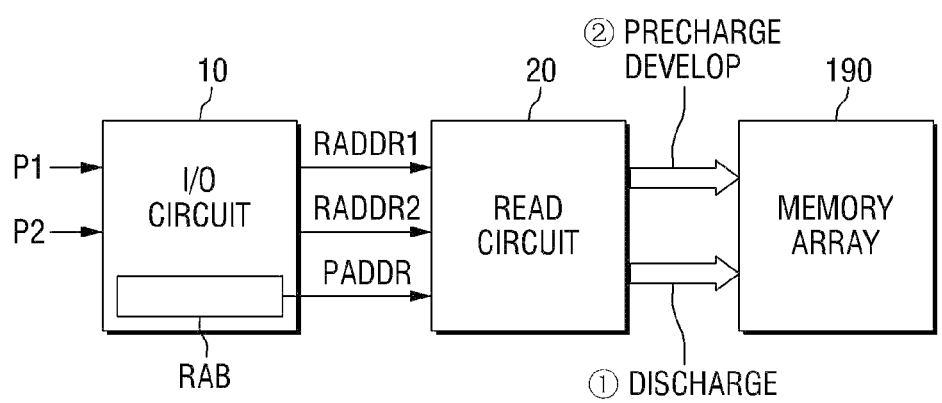
FIG. 1 is a block diagram of a nonvolatile memory device, according to an embodiment of the inventive concept.

Embodiments of the inventive concept are described below with reference to the accompanying drawings. These embodiments are presented as teaching examples and should not be construed to limit the scope of the inventive concept.

In the description that follows, where a feature is referred to as being "connected to," or "coupled to" another feature, it can be directly connected to or coupled to feature or intervening features may be present. In contrast, where a feature is referred to as being "directly connected to" or "directly coupled to" another feature, there are no intervening features present. As used herein, the term "and/or" indicates any and all combinations of one or more of the associated listed items.

The terms first, second, etc. may be used to describe various features, but the described features should not be limited by these terms. Rather, these terms are used merely to distinguish between different features. Thus, for example, a first feature discussed below could be termed a second feature without departing from the teachings of the inventive concept. The terms "a" and "an" and "the" and similar referents are to be construed to cover both the singular and the plural, unless otherwise indicated herein or clearly contradicted by context. Terms such as "comprising," "having," "including," and "containing" are to be construed as open-ended terms unless otherwise noted.

Unless defined otherwise, all technical and scientific terms used herein have the same meaning as commonly understood by one of ordinary skill in the art. The use of any and all examples, or terms provided herein is intended merely to better illuminate the inventive concept and is not a limitation on the scope of the inventive concept unless otherwise specified. Further, unless indicated to the contrary, all terms defined in generally used dictionaries are to be interpreted in relevant context and are not be construed in an overly formal sense.

As used herein, the terms "core access operation", "core read operation", and "core write operation" refer to various memory access operations that are performed on a memory array or memory core. In contrast, the terms "overlay window access operation", "overlay window read operation", and "overlay window write operation" refer to various memory access operations that are performed on components sharing the virtual address space with the memory cells. In other words, in this context, the term "overlay window" refers to memory mapped components (e.g., overlay window registers) that share a virtual address space with the memory array or memory core.

Certain embodiments of the inventive concept will be described with reference to a PRAM, but the inventive concept is not restricted to PRAM devices. For example, certain concepts described with reference to the PRAM could also be applied to other nonvolatile memory devices comprising resistance materials such as, e.g., RRAM and FRAM devices. In addition, certain embodiments will be described with reference to core read operations, but the inventive concept is not restricted to these types of operations. For example, certain That is, the inventive concept can also be applied to other operations including, for example, a core write operation, a core overwrite operation, a core erase operation, and the like.

Figure 2:
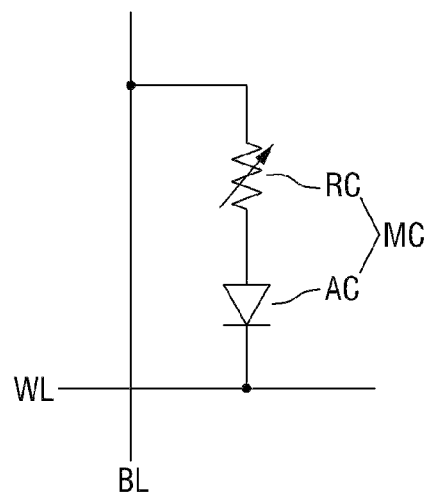
FIG. 2 is a circuit diagram of a memory cell in the nonvolatile memory device of FIG. 1, according to an embodiment of the inventive concept.

FIG. 1 is a block diagram of a nonvolatile memory device according to an embodiment of the inventive concept, and FIG. 2 is a circuit diagram of a nonvolatile memory cell in the nonvolatile memory device shown in FIG. 1, according to an embodiment of the inventive concept.

Referring to FIG. 1, a nonvolatile memory device 1 comprises an I/O circuit 10, a read circuit 20, and a memory array 190 (also referred to as memory core 190).

Memory array 190 comprises multiple nonvolatile memory cells (MCs) shown in FIG. 2. The nonvolatile MCs store data using a resistance material. Each of the nonvolatile MCs comprises a variable resistive circuit (RC) comprising a phase change material having different resistance values according to the data stored and an access circuit (AC) controlling current flowing into the AC. The ACs may comprise diodes, transistors, or the like, which may be coupled to the RCs in series. In the embodiment shown in FIG. 2, a diode is used as the AC.

The phase change material typically comprises a combination of two elements, such as GaSb, InSb, InSe, $Sb_2Te_3$ or GeTe, a combination of three elements, such as GeSbTe, GaSeTe, $InSbTe$, $SnSb_2Te_4$ or InSbGe, or a combination of four elements such as AgInSbTe, (GeSn)SbTe, GeSb(SeTe) or $Te_{81}Ge_{15}Sb_2S_2$. GeSbTe, which is a combination of germanium (Ge), antimony (Sb) and tellurium (Te), is commonly used as the phase change material.

I/O circuit 10 sequentially receives a first packet signal P1 and a second packet signal P2, which collectively provide information for performing a single core read operation. These packet signals are provided in succession, i.e., first packet signal P1 is first supplied and second packet signal P2 is then supplied. Although two packet signals P1 and P2 are discussed in this example, the inventive concept is not limited thereto. For example, four packet signals could correspond to one core read operation.

The first and second packet signals P1 and P2 are typically supplied in synchronization with a clock signal. For example, first packet signal P1 may be supplied in synchronization with a first clock edge (e.g., a rising edge of a clock) and second packet signal P2 may be supplied in synchronization with a second clock edge (e.g., a falling edge of the clock).

First packet signal P1 may comprise a command, a first row address RADDR1 and a buffer select signal BA, but is not limited thereto. Second packet signal P2 may comprise a second row address RADDR2, but is not limited thereto. Examples of first packet signal P1 and second packet signal P2 are described in detail with reference to FIG. 6. In general, first row address RADDR1 may be an upper address of second row address RADDR2. Alternatively, first row address RADDR1 may be a lower address of second row address RADDR2.

I/O circuit 10 comprises multiple RABs. Each of the RABs stores a partition address PADDR. Buffer select signal BA of first packet signal P1 selects one of the RABs.

As described above, I/O circuit 10 sequentially receives packet signals P1 and P2. In some circumstances, the first received signal among first and second packet signals P1 and P2 provides enough information for initiating or performing part of the core read operation, so the core operation can begin before the other signal is received. For example, the core read operation may be initiated upon receiving and decoding first packet signal P1, without waiting to receive second packet signal P2. Under these circumstances, a core read operation can begin based on information in first packet signal P1.

In certain embodiments described below, the core read operation comprises a bit line discharge operation, a bit line precharge operation, and a develop operation. In such embodiments, the bit line precharge operation may be performed upon receiving and decoding first packet signal P1, without waiting to receive second packet signal P2. Alternatively or additionally, other operations may be performed based on the first packet signal P1, such as selection of a row address buffer RAB by buffer select signal BA of first packet signal P1. Read circuit 20 first performs a discharge operation using partition address PADDR of the selected row address buffer RAB. Next, after decoding up to second packet signal P2 is performed, read circuit 20 performs a precharge operation and a develop operation using first row address RADDR1 and second row address RADDR2.

The bit line discharge operation is typically performed on a bank basis, so a region discharged by partition address PADDR may be designated. However, precharged and developed regions may be designated by a combination of first row address RADDR1 and second row address RADDR2. After second packet signal P2 is decoded, the core read operation may be stopped according to the decoding result.

Where a command in first packet signal P1 indicates a read operation, the read operation may be either a core read operation or an overlay window register read operation. To confirm whether the command corresponds to an overlay window register read, it is confirmed whether or not some of second row address RADDR2 of second packet signal P2 (e.g., address bits a13 and a14 of FIG. 6) are matched to an overlay window address. If so, the overlay window register read operation is performed instead of the core read operation. Consequently, the core read operation is stopped and the overlay window register read operation is performed.

In nonvolatile memory device 1, the core read operation starts before decoding second packet signal P2, i.e., before confirming whether the command indicates the overlay window register read operation. This may improve performance because the command is typically more likely to indicate the core read operation than to indicate the overlay window register read operation, and a much longer time is required to perform the core read operation than the overlay window register read operation.

Where part of the core read operation is first performed in such a manner, core read latency tAA may be reduced. Similarly, RAS-CAS delay tRCD may also be reduced because the core read operation is performed without waiting for all of packet signals P1 and P2 to be received.

A more detailed example of read circuit 20 performing the aforementioned operation will be described below with reference to FIG. 3, and a more detailed example of I/O 10 will be described with reference to FIGS. 4, 5, 7, 8 and 9.

Figure 3:
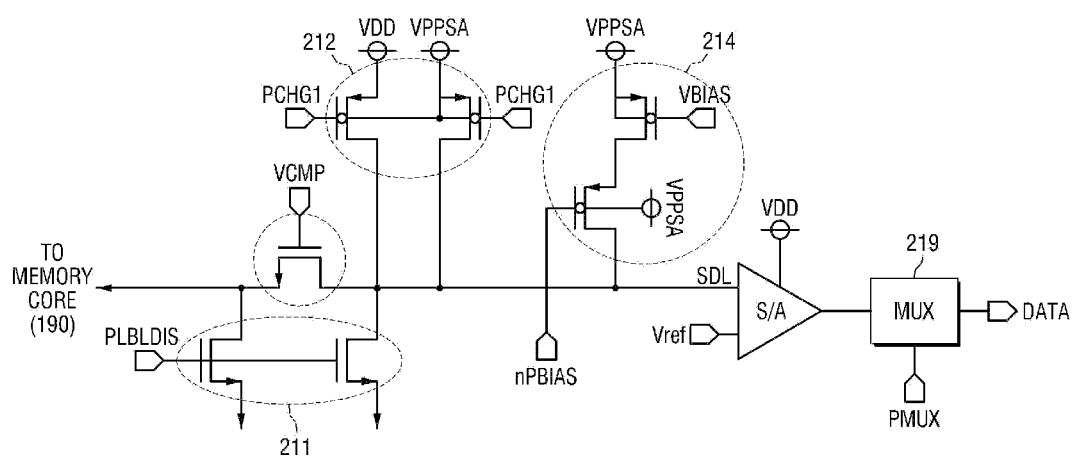
FIG. 3 is a circuit diagram of a read circuit shown in FIG. 1, according to an embodiment of the inventive concept.

FIG. 3 is a circuit diagram of read circuit 20 of FIG. 1, according to an embodiment of the inventive concept.

Referring to FIG. 3, read circuit 20 comprises a discharge unit 211, a precharge unit 212, a compensation unit 214, a clamping unit 216, a sense amplifier (AMP) 218, and a multiplexer (MUX) 219.

Discharge unit 211 discharges a bit line (i.e., a sensing node) electrically connected to memory array 190. Discharge unit 211 comprises an NMOS transistor controlled by a discharge control signal PLBLDIS.

Precharge unit 212 precharges a sensing node to a predetermined level, for example, a power supply voltage VDD or a step-up voltage VPPSA, during a precharge period, preceded by a develop operation. Precharge unit 212 comprises a PMOS transistor controlled by precharge control signal PCHG1. To compensate for a reduction in the level of a sensing node generated by current Icell flowing through the selected nonvolatile memory cell (MC of FIG. 2), compensation unit 214 supplies a compensation current to the sensing node.

Where a nonvolatile memory cell is in a SET state, the resistance of a phase change material may be small, such that the amount of penetration current Icell is large. Where a nonvolatile memory cell is in a RESET state, the resistance of a phase change material may be large, such that the amount of penetration current Icell is small. The magnitude of the compensation current supplied from compensation unit 214 may be such as to compensate for penetration current Icell in the RESET state. In this case, a level of the sensing node in the SET state is reduced while a level of the sensing node in the RESET state is maintained constant. Thus, a difference between the level of sensing node in the RESET state and the level of sensing node in the SET state may be great. Thus, it may be easy to distinguish between the SET state and the RESET state. By doing so, a sensing margin may be increased. Compensation unit 214 may comprise a PMOS transistor controlled by a compensation control signal nPBIAS and a PMOS transistor controlled by a voltage signal VBIAS.

Clamping unit 216 clamps a level of bit line BL coupled to the selected nonvolatile memory cell within a proper range to read. In detail, clamping unit 216 clamps the level of bit line BL to a predetermined level lower than a critical voltage of the phase change material. This is because, where the level of bit line BL is greater than or equal to the critical voltage, the phase of the phase change material of the selected phase change memory cell may be changed. Clamping unit 216 comprises an NMOS transistor controlled by a clamping control signal VCLAMP.

Sense AMP 218 compares a level of the sensing node and a set reference voltage Vref, and outputs results of the comparison to an output terminal. Sense AMP 218 may be a current sense AMP or a voltage sense AMP. MUX 219 outputs an output signal of sense AMP 218 as data. MUX 219 is enabled by a MUX control signal PMUX.

Figure 4:
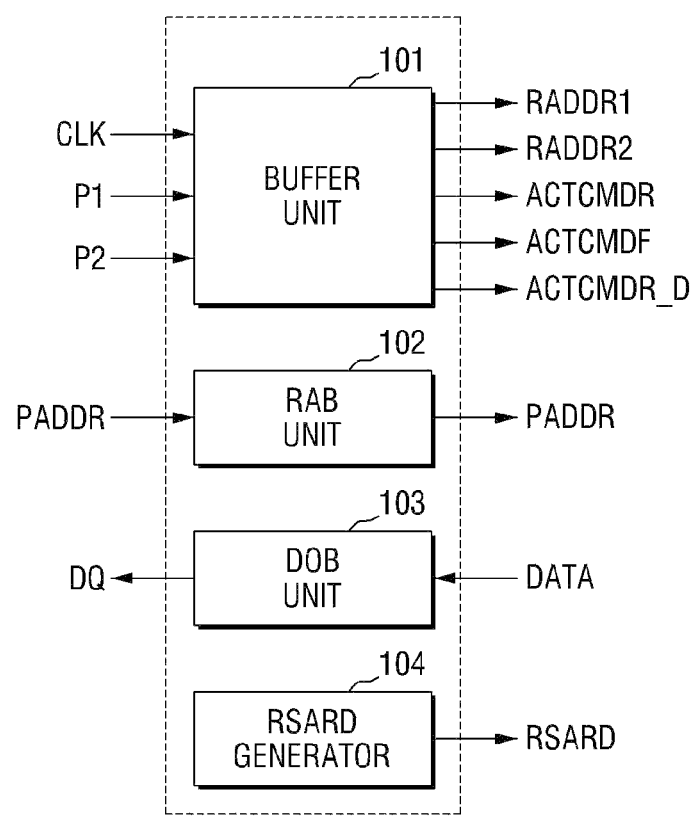
FIG. 4 is a block diagram of an I/O circuit shown in FIG. 1, according to an embodiment of the inventive concept.

FIG. 4 is a block diagram of I/O circuit 10 of FIG. 1, according to an embodiment of the inventive concept.

Referring to FIG. 4, I/O circuit 10 comprises a buffer unit 101, a RAB unit 102, a DOB unit 103, and a core read start signal (RSARD) generator 104.

Buffer unit 101 generates a first row address RADDR1, a second row address RADDR2, a first edge signal ACTC-MDR, a second edge signal ACTCMDF, and a set up signal ACTCMDR_D using a clock CLK, first packet signal P1, and second packet signal P2, which is described in more detail with reference to FIG. 5.

RAB unit 102 receives and buffers partition address PADDR, and it receives and selectively outputs buffer select signal BA. Partition address PADDR is an upper address (e.g., address bits a20 to a32 of FIG. 6), which is described in more detail with reference to FIG. 7. DOB unit 103 receives and buffers the data output from memory array 190, and it receives and selectively outputs buffer select signal BA, which is described in more detail with reference to FIG. 8.

In the foregoing examples, RAB unit 102 and DOB unit 103 receive the same buffer select signal BA, but the inventive concept is not limited thereto. Alternatively, RAB unit 102 and DOB unit 103 may receive different select signals.

RSARD generator 104 generates a core read start signal RSARD using the second edge signal ACTCMDF and set up signal ACTCMDR_D. Core read start signal RSARD is an internal command instructing to start a core read operation, which is described in more detail with reference to FIG. 9.

Figures 5, 6:
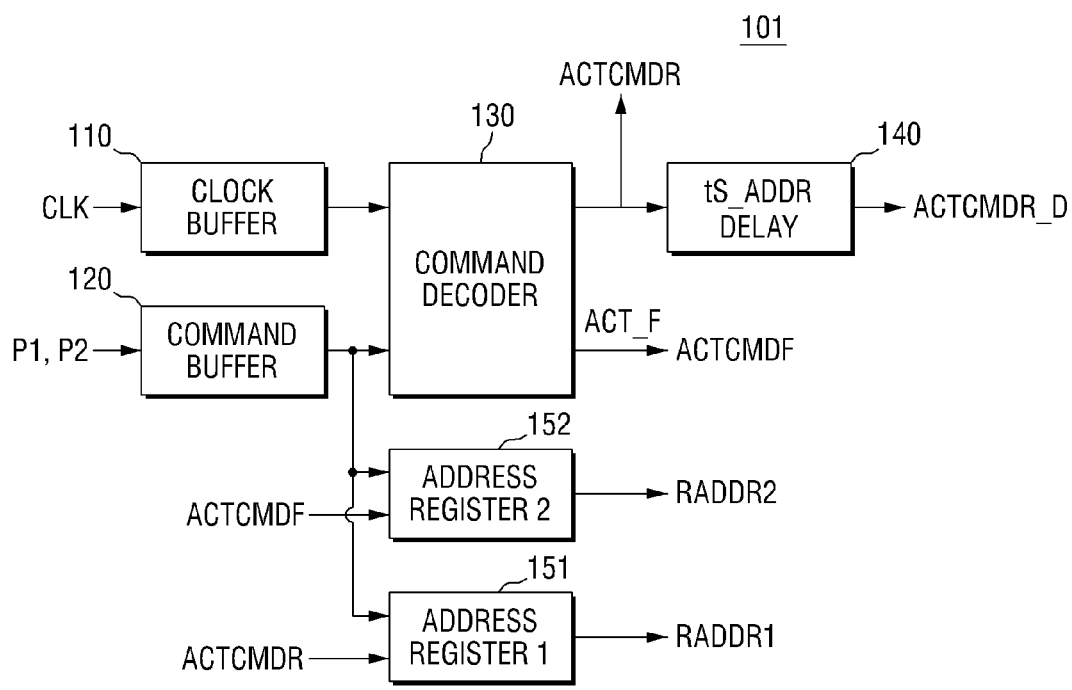
FIG. 5 is a block diagram of a buffer unit shown in FIG. 4, according to an embodiment of the inventive concept.
FIG. 6 illustrates a first packet signal and a second packet signal for a read operation, according to an embodiment of the inventive concept.

FIG. 5 is a block diagram of buffer unit 101 of FIG. 4, according to an embodiment of the inventive concept. FIG. 6 illustrates a first packet signal and a second packet signal for a read operation, according to an embodiment of the inventive concept.

Referring to FIG. 5, buffer unit 101 comprises a clock buffer 110, a command buffer 120, a command decoder 130, a first address register 151, a second address register 152, and a delay 140. Clock buffer 110 receives a clock CLK from an external source. Command buffer 120 receives first packet signal P1 and second packet signal P2 from an external source.

Referring to FIG. 6, first packet signal P1, which is received in synchronization with a rising edge of clock CLK, comprises commands (e.g., L and H input from CA0 and CA1), a first row address RADDR1 (e.g., address bits a15 to a19 input from CA2 to CA6), a buffer select signal BA (e.g., BA0 and BA1 input from CA7 and CA8). Buffer select signal BA selects at least one of multiple address buffers RAB_A to RAB_D to be described later, or at least one of multiple data buffers DOB_A to DOB_D. Second packet signal P2, which is received in synchronization with a falling edge of clock CLK, comprises a second row address RADDR2 (e.g., address bits a5 to a14 input from CA0 to CA9). That is to say, a command or an address may be input to the CA0 and CA1 according to whether the clock is at the rising edge or the falling edge.

Referring again to FIG. 5, command decoder 130 receives clock CLK, first packet signal P1 and second packet signal P2 and decodes the same. As the result, command decoder 130 generates a first edge signal ACTCMDR and a second edge signal ACTCMDF. First edge signal ACTCMDR is a signal generated in synchronization with the rising edge of clock CLK, and second edge signal ACTCMDF is a signal generated in synchronization with the falling edge of clock CLK, but the inventive concept is not limited thereto.

Delay 140 receives first edge signal ACTCMDR and generates a set up signal ACTCMDR_D delayed by a partition address set up time tS_PADDR. First address register 151 receives first edge signal ACTCMDR and first packet signal P1 and supplies first row address RADDR1. Second address register 152 receives second edge signal ACTCMDF and second packet signal P2 to supplies second row address RADDR2.

Figure 7:
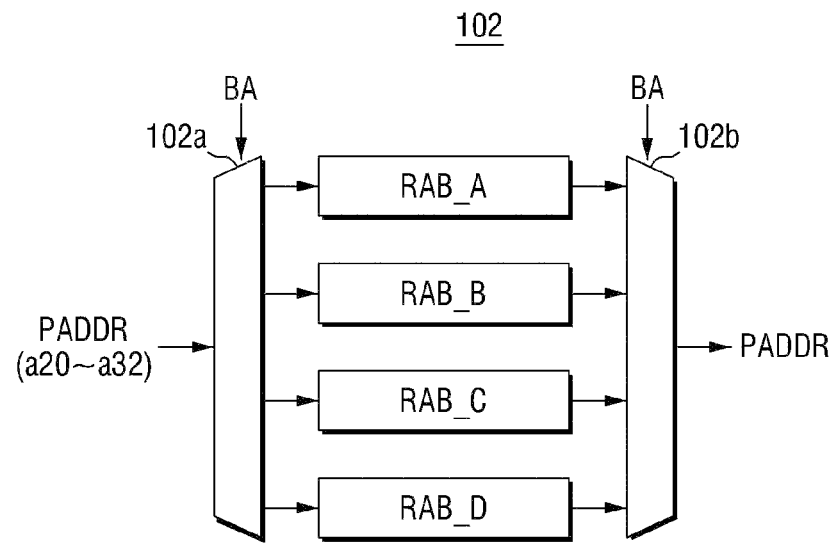
FIG. 7 is a block diagram of a row address buffer (RAB) unit shown in FIG. 4, according to an embodiment of the inventive concept.

FIG. 7 is a block diagram of RAB unit 102 of FIG. 4, according to an embodiment of the inventive concept.

Referring to FIG. 7, RAB unit 102 comprises multiple address buffers RAB_A to RAB_D, a first MUX 102a and a second MUX 102b. In FIG. 7, four address buffers RAB_A to RAB_D are shown, but the inventive concept is not limited thereto, and the number of address buffers may vary.

Partition address PADDR is different from first row address RADDR1 and second row address RADDR2. Partition address PADDR is an upper address, e.g., address bits a20 to a32. Partition address PADDR is stored in one (e.g., RAB_A) of address buffers RAB_A to RAB_D. Meanwhile, one of address buffers RAB_A to RAB_D may be selected using buffer select signal BA in first row address RADDR1. Where buffer select signal BA is input to second MUX 102b, partition address PADDR stored in the address buffer (e.g., RAB_A) corresponding to buffer select signal BA is output. A region of the memory array, corresponding to partition address PADDR may be a discharged region.

Figure 8:
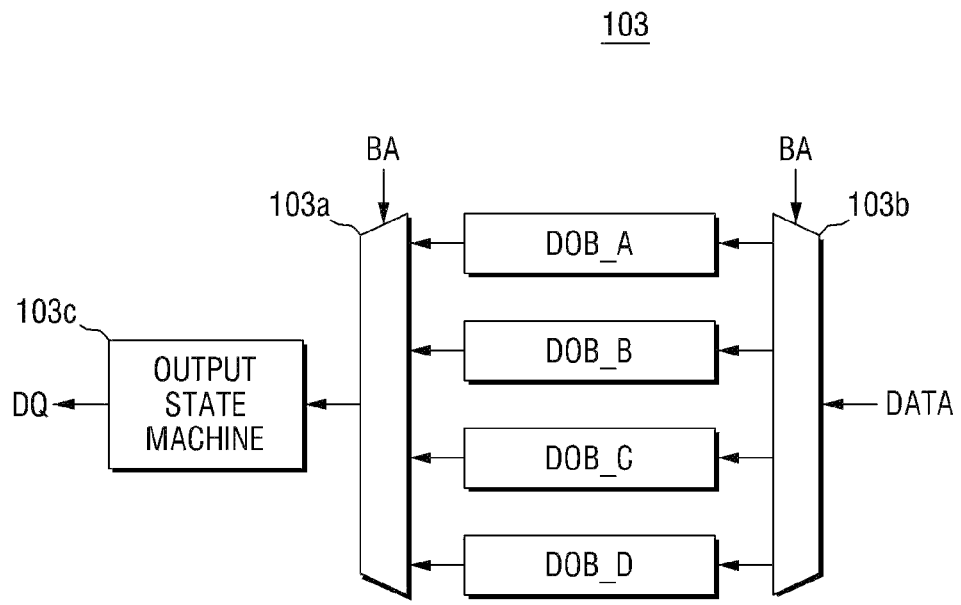
FIG. 8 is a block diagram of a data output buffer (DOB) unit shown in FIG. 5, according to an embodiment of the inventive concept.

FIG. 8 is a block diagram of DOB unit 103 of FIG. 4, according to an embodiment of the inventive concept.

Referring to FIG. 8, DOB unit 103 comprises multiple data buffers DOB_A to DOB_D, a third MUX 103a, a fourth MUX 103b, and an output state machine 103c. In FIG. 8, four data buffers DOB_A to DOB_D are shown, but the inventive concept is not limited thereto, and the number of data buffers may vary.

Data DATA output from the memory array may be stored in one of data buffers DOB_A to DOB_D. Here, one of data buffers DOB_A to DOB_D may be selected using buffer select signal BA in first row address RADDR1. Where buffer select signal BA is input to fourth MUX 103b, data DATA is stored in the data buffer (e.g., DOB_A) corresponding to buffer select signal BA. Similarly, where buffer select signal BA is input to third MUX 103a, data DATA stored in the data buffer (e.g., DOB_A) corresponding to buffer select signal BA is output.

Output state machine 103c separates output data DATA in units of a predetermined number of bits (e.g., 256 bits) using predetermined addresses a0 to a4 and outputs data DATA to DQ pins.

Figure 9:
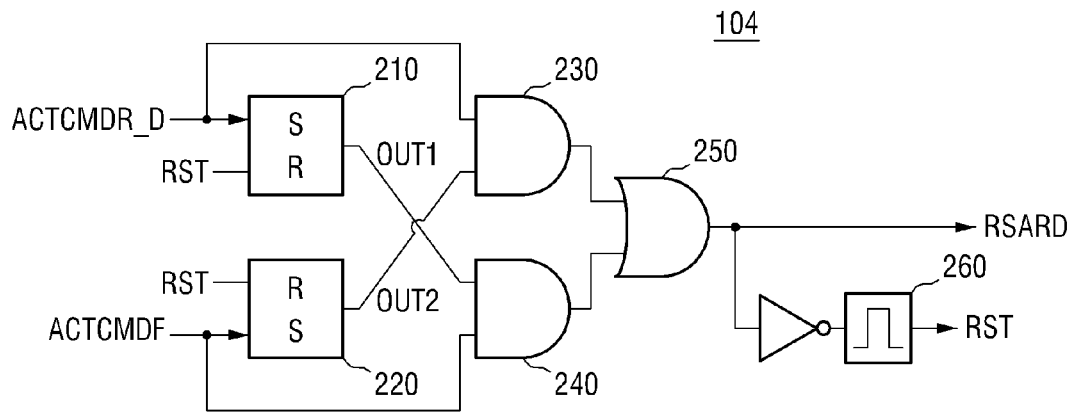
FIG. 9 illustrates a core read start signal generator shown in FIG. 5, according to an embodiment of the inventive concept.

FIG. 9 illustrates a core read start signal generator 104 of FIG. 5, according to an embodiment of the inventive concept.

Referring to FIG. 9, core read start signal RSARD is an internal command that controls the start a core read operation. Where core read start signal RSARD is activated, the core read operation is started. Read circuit 20 comprises SR latches 210 and 220, AND operators 230 and 240, an OR operator 250 and a pulse generator 260.

SR latch 210 is reset by a reset signal RST. Where set up signal ACTCMDR_D is activated to a high level, for example, a first output signal OUT1 of a high level is output accordingly. Similarly, SR latch 220 is reset by reset signal RST. Where the second edge signal ACTCMDF is activated to a high level, for example, a second output signal OUT2 of a high level is output accordingly.

AND operator 230 receives second output signal OUT2 of SR latch 220 and set up signal ACTCMDR_D. Where second output signal OUT2 and set up signal ACTCMDR_D are both at high levels, high level is output. AND operator 240 receives first output signal OUT1 of SR latch 220 and second edge signal ACTCMDF. Where first output signal OUT1 and second edge signal ACTCMDF are both at high levels, high level is output.

OR operator 250 receives output values of AND operators 230 and 240. Where one of two output values of OR operator 250 is at a high level, a core read start signal RSARD instructing to start a core read is output. Consequently, where set up signal ACTCMDR_D and second edge signal ACTCMDF are both activated (e.g., at a high level), core read start signal RSARD is activated. Pulse generator 260 generates a reset signal RST using an inverted value of core read start signal RSARD.

Figure 10:
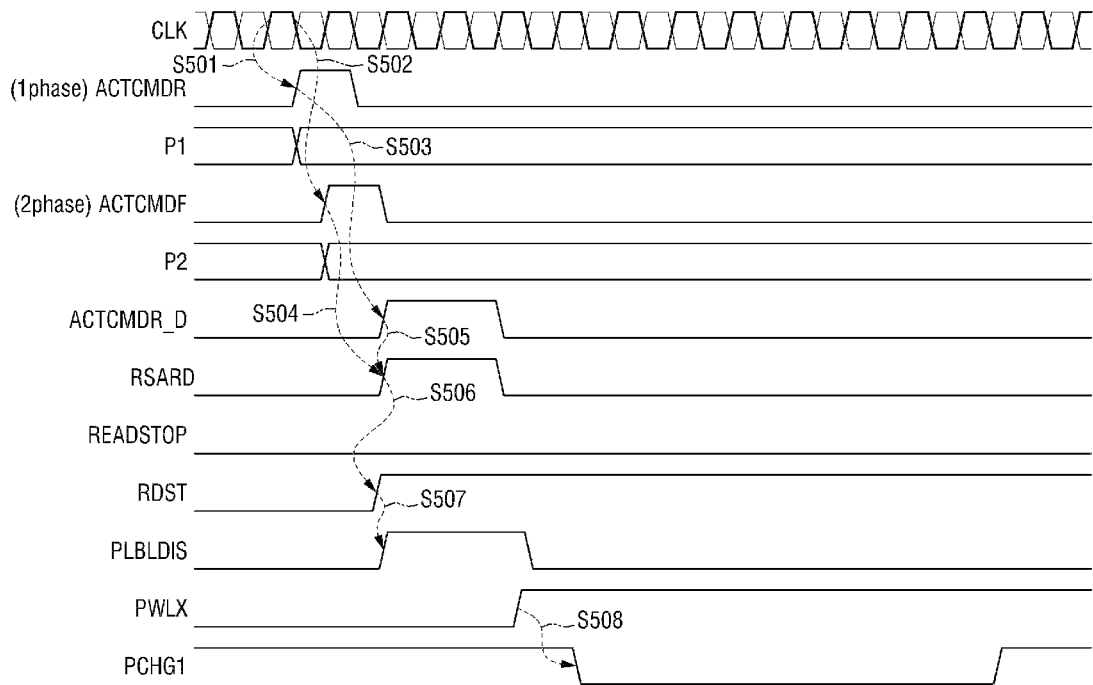
FIG. 10 is a timing diagram illustrating a method of operating a nonvolatile memory device, according to an embodiment of the inventive concept.

FIGS. 10 and 11 are timing diagrams illustrating a method of operating a nonvolatile memory device according to an embodiment of the inventive concept. FIGS. 10 and 11 illustrate an operation at high frequency (e.g., 166 Mbps or higher). FIG. 10 illustrates an example where a core read operation is continuously performed, and FIG. 11 illustrates an example where a core read operation is stopped while being performed.

Referring to FIG. 10, a first edge signal ACTCMDR is generated in synchronization with a first edge (e.g., a rising edge) of clock CLK (S501), and first packet signal P1 is input in synchronization with the first edge of clock CLK. Next, a first edge signal ACTCMDR is generated in synchronization with a second edge (e.g., a falling edge) of clock CLK (S502), and second packet signal P2 is input in synchronization with the second edge of clock CLK.

Set up signal ACTCMDR_D is delayed from the first edge of clock CLK by a partition address set up time tS_PADDR to then be activated (S503). Here, only after the passage of the partition address set up time tS_PADDR, a partition address can be used. That is to say, the partition address set up time tS_PADDR is a time required to initiate a subsequent next operation. As buffer select signal BA of first packet signal P1 is activated, buffer select signal BA selects one of address buffers RAB_A to RAB_D. Partition address PADDR of the address buffer selected among address buffers RAB_A to RAB_D is supplied to read circuit 20.

As indicated above, core read start signal RSARD is an internal command that initiates the performance of a core read operation. Core read start signal RSARD is generated based on second edge signal ACTCMDF and set up signal ACTCMDR_D. Where the second edge signal ACTCMDF is activated and set up signal ACTCMDR_D is then activated, core read start signal RSARD is activated (S504 and S505).

Because the second edge signal ACTCMDF is activated earlier than set up signal ACTCMDR_D at high frequency, an activating time of core read start signal RSARD may be determined by set up signal ACTCMDR_D. Set up signal ACTCMDR_D is activated after the passage of the partition address set up time tS_PADDR. where core read start signal RSARD is activated after set up signal ACTCMDR_D is activated, a bit line discharge operation may be performed using partition address PADDR. Alternatively, only set up signal ACTCMDR may be generated.

Core read state signal RDST is a signal indicating that a core read operation is being performed. After receiving core read start signal RSARD, core read state signal RDST is activated (S506). In detail, where core read state signal RDST is activated to a high level, the core read operation is performed. As described above, discharge control signal PLBLDIS is a signal controlling discharge unit 211 of the read circuit (e.g., read circuit 20 of FIG. 3). Discharge control signal PLBLDIS is activated to a high level to discharge a bit line. After receiving core read state signal RDST, discharge control signal PLBLDIS is activated (S507).

As described above, precharge control signal PCHG1 is a signal controlling precharge unit 212 of the read circuit (e.g., read circuit 20 of FIG. 3). Precharge control signal PCHG1 is activated to a low level and precharges a bit line. Where a word line select signal PWLX is received, precharge control signal PCHG1 is activated (S508).

Meanwhile, it is confirmed that core read stop signal READSTOP is maintained at a low state without being activated. In detail, while the core read operation is being performed, second packet signal P2 is decoded to confirm whether or not some (e.g., address bits a13 and a14 of FIG. 6) of second row address RADDR2 are matched to the overlay window address. If not, the core read operation is continuously performed. Thus, core read stop signal READSTOP is not activated.

Referring to FIG. 11, where the core read operation is stopped while being performed, the following operations are performed. First edge signal ACTCMDR is generated in synchronization with a first edge (e.g., a rising edge) of clock CLK (S501). First edge signal ACTCMDR is generated in synchronization with a second edge (e.g., a falling edge) of clock CLK (S502). Set up signal ACTCMDR_D is delayed from the first edge of clock CLK by a partition address set up time tS_PADDR to then be activated (S503). Where second edge signal ACTCMDF is activated and set up signal ACTCMDR_D is then activated, core read start signal RSARD is activated (S504 and S505). After receiving core read start signal RSARD, core read state signal RDST is activated (S506). After receiving core read state signal RDST, discharge control signal PLBLDIS is activated (S507). After receiving a word line select signal PWLX, precharge control signal PCHG1 is activated (S508).

While the core read operation is being performed, core read stop signal READSTOP is activated. While the core read operation is being performed, some of second row address RADDR2 of second packet signal P2 (e.g., address bits a13 and a14) are matched to the overlay window address, the core read operation is stopped and the overlay window register read operation needs to be performed. Therefore, where some of second row address RADDR2 of second packet signal P2 is matched to the overlay window address, core read stop signal READSTOP is activated.

After receiving core read stop signal READSTOP, core read state signal RDST is inactivated to a low level (S511). Accordingly, the word line select signal PWLX is also inactivated (S512), and after receiving the word line select signal PWLX, precharge control signal PCHG1 is also inactivated (S513).

Figure 13:
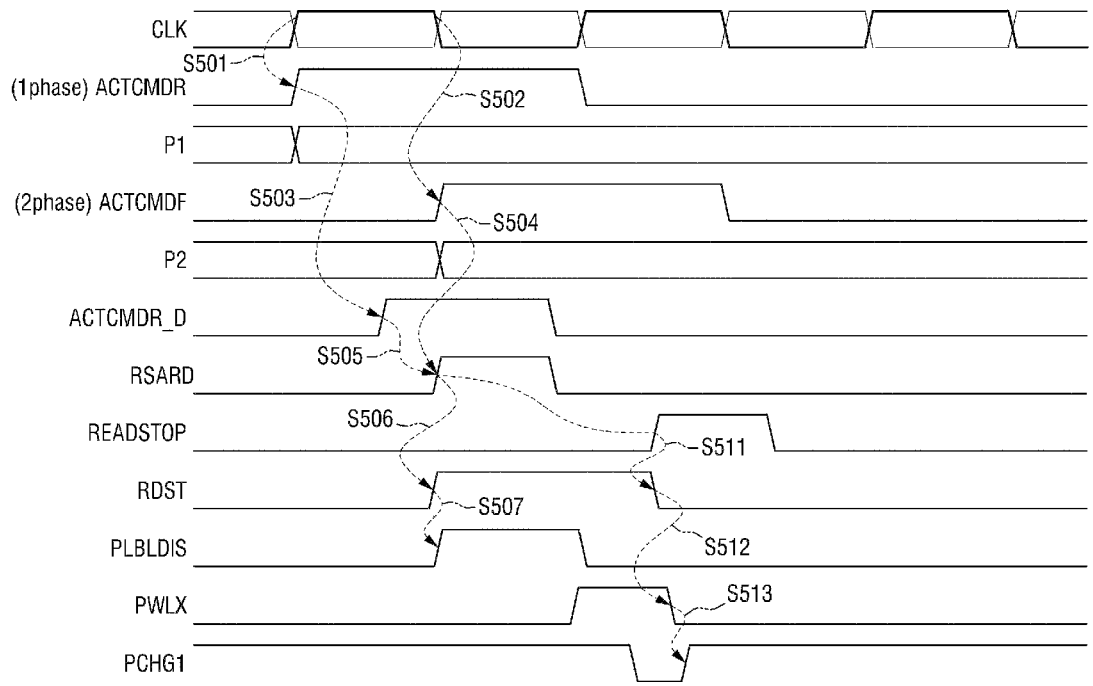
FIG. 13 is a timing diagram illustrating a method of operating a nonvolatile memory device, according to an embodiment of the inventive concept.

FIGS. 12 and 13 are timing diagrams illustrating a method of operating a nonvolatile memory device, according to an embodiment of the inventive concept. FIGS. 12 and 13 illustrate an operation at low frequency (e.g., less than 166 Mbps). The following description will focus on differences from FIGS. 10 and 11. FIG. 12 illustrates an example where a core read operation is continuously performed, and FIG. 13 illustrates an example where a core read operation is stopped while being performed.

Referring to FIGS. 12 and 13, where second edge signal ACTCMDF is activated and set up signal ACTCMDR_D is then activated, core read start signal RSARD is activated (S504, S505). Because set up signal ACTCMDR_D is activated earlier than second edge signal ACTCMDF at low frequency, an activating time of core read start signal RSARD may be determined by second edge signal ACTCMDF.

Figure 14:
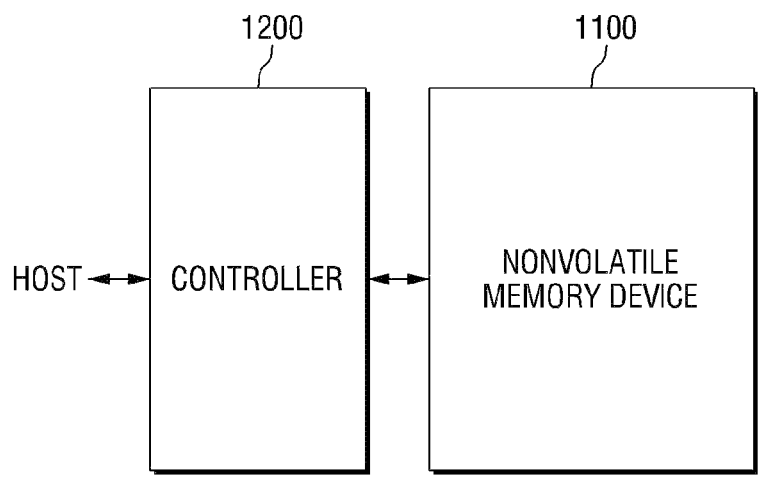
FIG. 14 is a block diagram of a memory system, according to an embodiment of the inventive concept.

FIG. 14 is a block diagram of a memory system, according to an embodiment of the inventive concept.

Referring to FIG. 14, memory system 1000 comprises a nonvolatile memory device 1100 and a controller 1200. Nonvolatile memory device 1100 may be configured and operated in accordance with the description of FIGS. 1 to 13.

Controller 1200 is connected to the host and nonvolatile memory device 1100. Controller 1200 accesses nonvolatile memory device 1100 in response to a request from the host. For example, controller 1200 may control read, write, erase, and background operations of nonvolatile memory device 1100. Controller 1200 provides interfacing between nonvolatile memory device 1100 and the host. Controller 1200 drives firmware for controlling nonvolatile memory device 1100.

As an example, controller 1200 may further comprise features such as a random access memory (RAM), a processing unit, a host interface, a memory interface, or the like. The RAM may be used as at least one of an operating memory of the processing unit, a cache memory between nonvolatile memory device 1100 and the host, and a buffer memory between nonvolatile memory device 1100 and the host. The processing unit controls operation of controller 1200.

The host interface may implement a protocol to exchange data between host and controller 1200. For example, controller 1200 may be configured to communicate with an external device (host) through one of various interface protocols such as universal serial bus (USB), multimedia card (MMC), peripheral component interconnection (PCI) protocol, PCI-express (PCI-E) protocol, advanced technology electronics (ATA) protocol, serial-ATA protocol, parallel-ATA protocol, small computer small interface (SCSI) protocol, enhanced small disk interface (ESDI) protocol, and integrated drive electronics (IDE) protocol. The memory interface may interface with nonvolatile memory device 1100. Here, the memory interface may comprise, for example, a NAND interface or a NOR interface.

Memory system 1000 further comprises an error correction block. The error correction block may be configured to detect and correct an error of the data stored in memory system 1100 using an error correction code (ECC). As an example, the error correction block may be provided as a component of controller 1200. Alternatively, the error correction block may also be provided as a component of nonvolatile memory device 1100.

Controller 1200 and nonvolatile memory device 1100 may be integrated into one semiconductor device. As an example, controller 1200 and nonvolatile memory device 1100 may be integrated into one semiconductor device to form a memory card. For example, controller 1200 and nonvolatile memory device 1100 may be integrated into one semiconductor device to form a Multi Media Card (MMC, RS-MMC, MMCmicro), a Secure Digital card (SD, miniSD, microSD), a Universal Flash storage (UFS), a PC card (originally PCMCIA or PCM-CIA card), a Compact Flash (CF) card, a Smart Media (SM) Card, a memory stick, and the like, but not limited thereto.

As another example, controller 1200 and nonvolatile memory device 1100 may be integrated into one semiconductor device to form a Solid State Disk/Drive (SSD). The SSD comprises a storage device configured to store data in a semiconductor memory.

Where memory system 1000 forms an SSD, the operating speed of the host connected to memory system 1000 is remarkably improved. As another example, memory system 1000 may comprise or be incorporated in a computer, an ultra mobile personal computer (UMPC), a work station, a netbook, a personal digital assistant (PDA), a portable computer, a web tablet, a wireless phone, a mobile phone, a smart phone, an e-book, a portable multimedia player (PMP), a portable game console, a navigation device, a black box, a digital camera, a 3-dimensional television, a digital audio recorder, a digital audio player, a digital picture recorder, a digital picture player, digital video recorder, a digital video player, a device capable of transmitting/receiving information in wireless environments, one of various electronic devices constituting a home network, one of various electronic devices constituting a computer network, one of various electronic devices constituting a telematics network, RFID devices, or embedded systems, but not limited thereto.

Nonvolatile memory device 1100 or memory system 1000 may be packaged in a variety of ways. For example, nonvolatile memory device 1100 or memory system 1000 may be mounted in a package on package (PoP), a ball grid array (BGA) package, a chip scale package (CSP), a plastic leaded chip carrier (PLCC), a plastic dual in-line package (PDIP), a die in waffle pack, a die in wafer form, a chip-on-board (COB), a ceramic dual in-line package (CERDIP), a plastic metric quad flat pack (MQFP), a thin quad flatpack (TQFP), a small outline (SOIC), a shrink small outline package (SSOP), a thin small outline (TSOP), a thin quad flatpack (TQFP), a system in package (SIP), a multi-chip package (MCP), a wafer-level fabricated package (WFP) or a wafer-level processed stack package (WSP).

Figure 15:
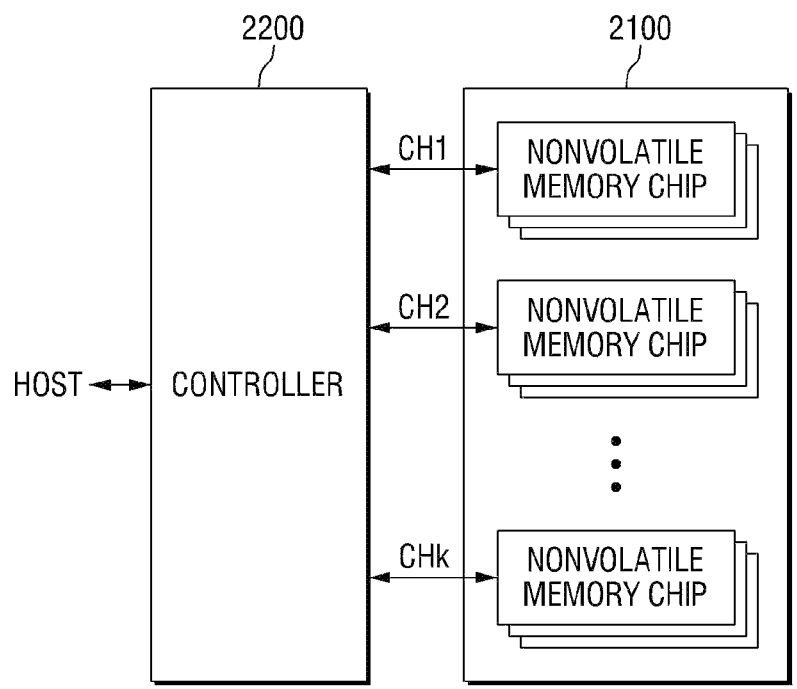
FIG. 15 is a block diagram of a memory system, according to an embodiment of the inventive concept.

FIG. 15 is a block diagram of a memory system, according to an embodiment of the inventive concept. The memory system of FIG. 15 is a variation of memory system 1000 illustrated in FIG. 14.

Referring to FIG. 15, memory system 2000 comprises a nonvolatile memory 2100 and a controller 2200. Nonvolatile memory 2100 comprises multiple nonvolatile memory chips. The nonvolatile memory chips are divided into multiple groups. Each group of the nonvolatile memory chips is configured to communicate with controller 2200 through a common channel. For example, the nonvolatile memory chips may communicate with controller 2200 through first to kth channels CH1 to CHk.

Each of the nonvolatile memory chips may be configured in the same manner as nonvolatile memory 100 shown in FIGS. 1 to 13. While the nonvolatile memory chips connected to one channel are shown in FIG. 15, memory system 2000 may be modified to connect one nonvolatile memory chip to one channel.

Figure 16:
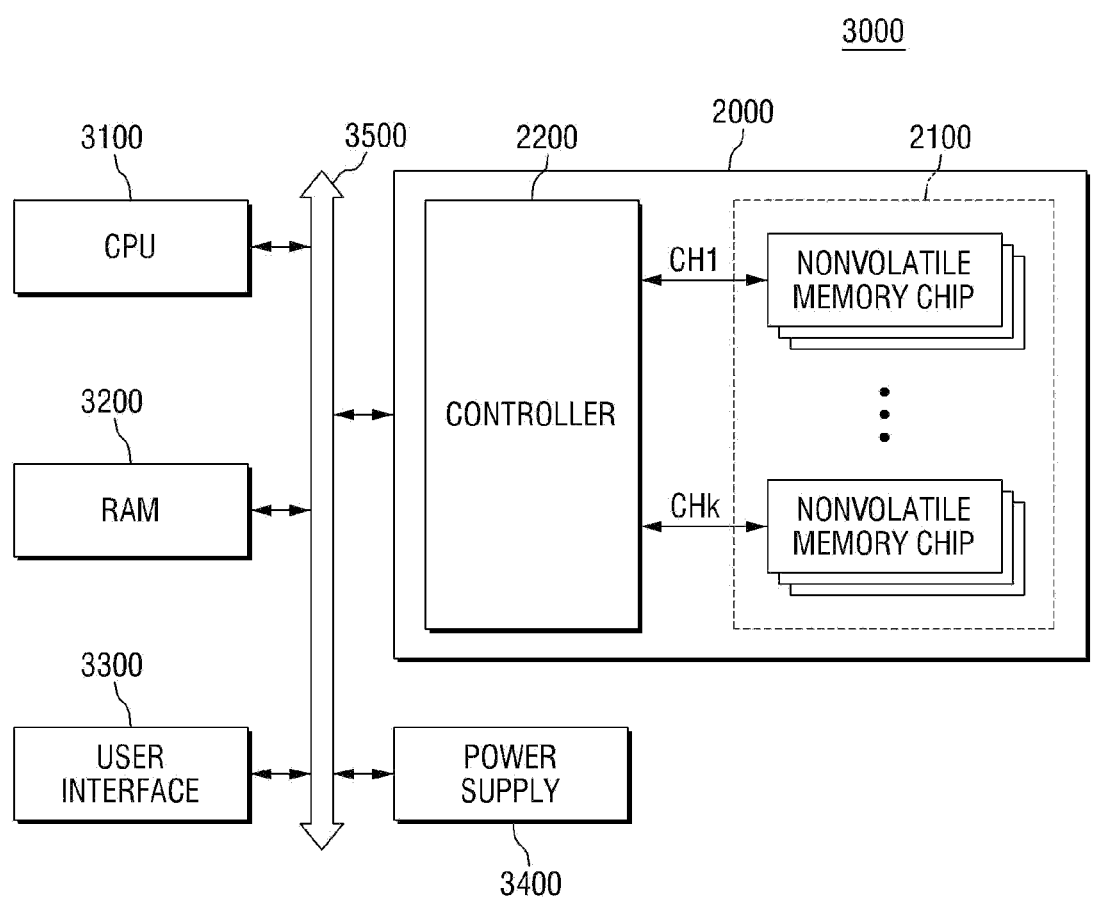
FIG. 16 is a block diagram of a computing system comprising the memory system of FIG. 15, according to an embodiment of the inventive concept.

FIG. 16 is a block diagram of a computing system comprising a memory system, according to an embodiment of the inventive concept. The computing system may be configured to incorporate one or both of memory systems 1000 and 2000 shown in FIGS. 14 and 15.

Referring to FIG. 16, a computing system 3000 comprises a central processing unit (CPU) 3100, a RAM 3200, a user interface 3300, a power supply 3400, and a memory system 2000.

Memory system 2000 is electrically connected to CPU 3100, RAM 3200, user interface 3300 and power supply 3400 through a system bus 3500. The data supplied through user interface 3300 or processed by CPU 3100 may be stored in memory system 2000. In FIG. 16, nonvolatile memories 2100 are connected to system bus 3500 through controller 2200. However, nonvolatile memories 2100 may alternatively be configured to be directly connected to system bus 3500.

The foregoing is illustrative of embodiments and is not to be construed as limiting thereof. Although a few embodiments have been described, those skilled in the art will readily appreciate that many modifications are possible in the embodiments without materially departing from the scope of the inventive concept. Accordingly, all such modifications are intended to be included within the scope of the inventive concept as defined in the claims.

What is claimed is:

1. A nonvolatile memory device, comprising:
a memory core comprising a plurality of variable resistance memory cells;
an input/output (I/O) circuit configured to receive a first packet signal and a second packet signal in sequence, the first and second packet signals collectively comprising information for a memory access operation, and further configured to initiate a core access operation upon decoding the first packet signal and to selectively continue or discontinue the core access operation upon decoding the second packet signal; and
a read circuit configured to perform part of the core access operation in response to the first packet signal before the second packet signal is decoded.

2. The nonvolatile memory device of claim 1, wherein the core access operation is a core read operation.

3. The nonvolatile memory device of claim 2, wherein the part of the core access operation is a bit line discharge operation for the core read operation.

4. The nonvolatile memory device of claim 2, wherein the first packet signal and the second packet signal comprise a first row address and a second row address for the core read operation, respectively.

5. The nonvolatile memory device of claim 4, wherein the I/O circuit determines whether the first and second packet signals correspond to the core read operation or a non-core read operation based on the second row address.

6. The nonvolatile memory device of claim 5, wherein the I/O circuit discontinues the core read operation upon determining that the first and second packet signals correspond to the non-core read operation, and continues the core read operation upon determining that the first and second packet signals correspond to the core read operation or the non-core read operation.

7. The nonvolatile memory device of claim 4, wherein the first row address is an upper address of the second row address.

8. The nonvolatile memory device of claim 1, wherein the first packet signal comprises a command.

9. The nonvolatile memory device of claim 8, wherein the read circuit performs the part of the core read operation after the I/O circuit receives the second packet signal.

10. The nonvolatile memory device of claim 1, wherein the I/O circuit comprises multiple address buffers in which partition addresses are stored, and the first packet signal comprises a buffer select signal for selecting one of the address buffers.

11. The nonvolatile memory device of claim 10, wherein the read circuit performs the part of the core read operation using the partition address of the address buffer selected by the buffer select signal.

12. The nonvolatile memory device of claim 11, wherein the read circuit performs the part of the core read operation after a set-up time of the partition address.

13. The nonvolatile memory device of claim 1, wherein the core access operation is discontinued as a consequence of determining that the second packet signal corresponds to an overlay window address.

14. The nonvolatile memory device of claim 1, wherein the first packet signal is supplied to the I/O circuit in synchronization with a rising edge of a clock and the second packet signal is supplied to the I/O circuit in synchronization with a falling edge of the clock.

15. The nonvolatile memory device of claim 1, wherein the variable resistance memory cells comprise phase change memory cells.

16. A method of operating a nonvolatile memory device, comprising:

receiving a first packet signal and a second packet signal in sequence, the first and second packet signals collectively comprising information for a memory access operation;

decoding the first packet signal, initiating a core access operation with respect to a memory array of the nonvolatile memory device upon decoding the first packet signal, and thereafter decoding the second packet signal;

selectively continuing or discontinuing the core access operation upon decoding the second packet signal.

17. The method of claim 16, wherein the core access operation is a core read operation of the nonvolatile memory device.

18. The method of claim 16, wherein initiating the core access operation comprises performing a bitline discharge operation on the memory array.

19. The method of claim 18, wherein continuing the core access operation comprises performing a bit line precharge operation, and a develop operation on the memory array.

20. The method of claim 16, further comprising, upon discontinuing the core access operation, accessing an overlay window register based on information in the first and second signal packets.

* * * * *